US009742366B2

(12) United States Patent
Galal

(10) Patent No.: US 9,742,366 B2
(45) Date of Patent: Aug. 22, 2017

(54) DIFFERENTIAL CLASS-D AMPLIFIER

(71) Applicant: QUALCOMM Incorporated, San Diego, CA (US)

(72) Inventor: Sherif Galal, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/798,647

(22) Filed: Jul. 14, 2015

(65) Prior Publication Data

US 2017/0019078 A1   Jan. 19, 2017

(51) Int. Cl.
| | | |
|---|---|---|
| H03F 3/38 | (2006.01) |
| H03F 3/45 | (2006.01) |
| H03F 3/217 | (2006.01) |
| H03F 1/34 | (2006.01) |
| H03F 1/02 | (2006.01) |
| H03F 3/19 | (2006.01) |
| H03F 3/21 | (2006.01) |
| H03F 3/187 | (2006.01) |

(52) U.S. Cl.
CPC ............ *H03F 3/217* (2013.01); *H03F 1/0205* (2013.01); *H03F 1/34* (2013.01); *H03F 3/187* (2013.01); *H03F 3/19* (2013.01); *H03F 3/211* (2013.01); *H03F 3/45076* (2013.01); *H03F 3/45475* (2013.01); *H03F 3/45932* (2013.01); *H03F 2200/03* (2013.01); *H03F 2200/451* (2013.01); *H03F 2203/21106* (2013.01); *H03F 2203/45116* (2013.01)

(58) Field of Classification Search
CPC ... H03F 3/38; H03F 3/387; H03F 2003/45022
USPC .................................................... 330/10, 258
See application file for complete search history.

(56) References Cited

U.S. PATENT DOCUMENTS

| 7,224,135 B1 | 5/2007 | Menegoli |
| 7,332,962 B2 | 2/2008 | Wu et al. |
| 7,414,471 B2 | 8/2008 | Krishnan et al. |
| 7,446,603 B2 | 11/2008 | Wong et al. |

(Continued)

FOREIGN PATENT DOCUMENTS

| CN | 102832887 A | 12/2012 |
| EP | 1139571 A1 | 10/2001 |

OTHER PUBLICATIONS

Cartasegna D., et al., "An Audio 91-dB THD Third-Order Fully-Differential Class-D Amplifier", 2011 Proceedings of the ESSCIRC (ESSCIRC), 2011, IEEE, pp. 91-94.

(Continued)

*Primary Examiner* — Steven J Mottola
(74) *Attorney, Agent, or Firm* — Paradice and Li LLP/Qualcomm

(57) ABSTRACT

A fully differential class-D amplifier having a controlled common-mode output voltage is disclosed. The differential class-D amplifier may include a correction circuit to determine the common-mode output voltage associated with differential pulse width modulated output signals and to generate differential correction signals to control the common-mode output voltage. In some exemplary embodiments, the differential class-D amplifier may include a plurality of gain stages to generate the differential PWM output signals. The differential correction signals may be provided to at least one stage of the differential class-D amplifier.

15 Claims, 13 Drawing Sheets

(56) References Cited

U.S. PATENT DOCUMENTS

| | | | |
|---|---|---|---|
| 7,482,865 B2 | 1/2009 | Kost et al. | |
| 7,573,327 B1 * | 8/2009 | Pertijs | H03F 3/387 |
| | | | 327/124 |
| 7,772,924 B2 * | 8/2010 | Matamura | H03F 3/2173 |
| | | | 330/10 |
| 8,207,788 B2 | 6/2012 | Lee et al. | |
| 2008/0111619 A1 | 5/2008 | Matamura | |
| 2008/0303590 A1 | 12/2008 | Wu et al. | |
| 2008/0310046 A1 | 12/2008 | Menegoli et al. | |
| 2009/0251216 A1 | 10/2009 | Giotta et al. | |
| 2010/0073063 A1 | 3/2010 | Lakshmikumar et al. | |
| 2013/0057238 A1 | 3/2013 | Fang et al. | |

OTHER PUBLICATIONS

Cartasegna P., et al., "A 0.18-mm CMOS, 92-dB THD, 105-dBA DR, Third-Order Audio Class-D Amplifier", 2013 Proceedings of the ESSCIRC (ESSCIRC), IEEE, 2003, pp. 169-172.

Chou Y.W, et al., "A Low THD Clock-Free Class-D Audio Amplifier with an Increased Damping Resistor and Cross Offset Cancellation Technique", IEEE International Symposium on Circuits and Systems (ISCAS), Jun. 2014, pp. 2680-2683.

International Search Report and Written Opinion—PCT/US2016/039904—ISA/EPO—Sep. 19, 2016.

* cited by examiner

US 9,742,366 B2

DIFFERENTIAL CLASS-D AMPLIFIER

TECHNICAL FIELD

The exemplary embodiments relate generally to amplifiers, and specifically to a differential class-D amplifiers.

BACKGROUND OF RELATED ART

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to generate a modulated RF signal, amplify the modulated RF signal to generate a transmit RF signal having the proper output power level, and transmit the transmit RF signal via an antenna to another device such as, for example, a base station. For data reception, the receiver may obtain a received RF signal via the antenna and may amplify and process the received RF signal to recover data sent by the other device.

The wireless device may transmit and receive communication data through a communication medium. In one example, the communication medium may be a wireless communication medium where communication data is transmitted and received by communication devices according to a wireless communication protocol. Example wireless communication protocols may include IEEE 802.11 protocols (e.g., Wi-Fi) and BLUETOOTH® protocols according to the Bluetooth Special Interest Group. Moreover, example wireless communication protocols may further include Long Term Evolution or LTE. LTE is a set of enhancements to the Universal Mobile Telecommunications System (UMTS) mobile standard promulgated by Third Generation Partnership Project (3GPP). In some examples, LTE provides over-the-air wireless communication of high-speed data for mobile phones and data terminals.

Analog signals within a wireless device may undergo amplification during various processing operations. Thus, amplifiers may be included within the wireless device to provide signal amplification. Different types of amplifiers may be available for different uses. For example, a wireless device such as a cellular phone may include a transmitter and a receiver for bi-directional communication. The transmitter may use a driver amplifier (DA) and a power amplifier (PA), the receiver may use a low noise amplifier (LNA), and the transmitter and receiver may both use variable gain amplifiers (VGAs).

Various classes of amplifiers may be used to implement the different types of amplifiers. A "class-D" amplifier, for example, may provide relatively power efficient operation by producing pulse width modulated (PWM) output signals. The PWM output signals may be generated by operating output transistors of the class-D amplifier as switches rather than operating them as linear gain devices. Operating the output transistors as switches may consume less power than operating the output transistors as linear gain devices.

Some class-D amplifiers may be differential class-D amplifiers designed to amplify differential input signals and generate differential PWM output signals. The differential PWM output signals may have an associated common-mode output voltage. An uncontrolled or poorly controlled common-mode voltage output may cause noise sensitivity, distorted output, and/or may affect the differential processing associated with the differential class-D amplifier.

Thus, there is a need to control the common-mode output voltage of differential class-D amplifiers.

BRIEF DESCRIPTION OF THE DRAWINGS

The exemplary embodiments are illustrated by way of example and are not intended to be limited by the figures of the accompanying drawings. Like numbers reference like elements throughout the drawings and specification.

DETAILED DESCRIPTION

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the exemplary embodiments. However, it will be apparent to one skilled in the art that these specific details may not be required to practice the exemplary embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The exemplary embodiments are not to be construed as limited to specific examples described herein but rather to include within their scope all exemplary embodiments defined by the appended claims.

In addition, the detailed description set forth below in connection with the appended drawings is intended as a description of exemplary embodiments of the present disclosure and is not intended to represent the only exemplary embodiments in which the present disclosure may be practiced. The term "exemplary" used throughout this description means "serving as an example, instance, or illustration," and should not necessarily be construed as preferred or advantageous over other exemplary embodiments.

Figure 1:
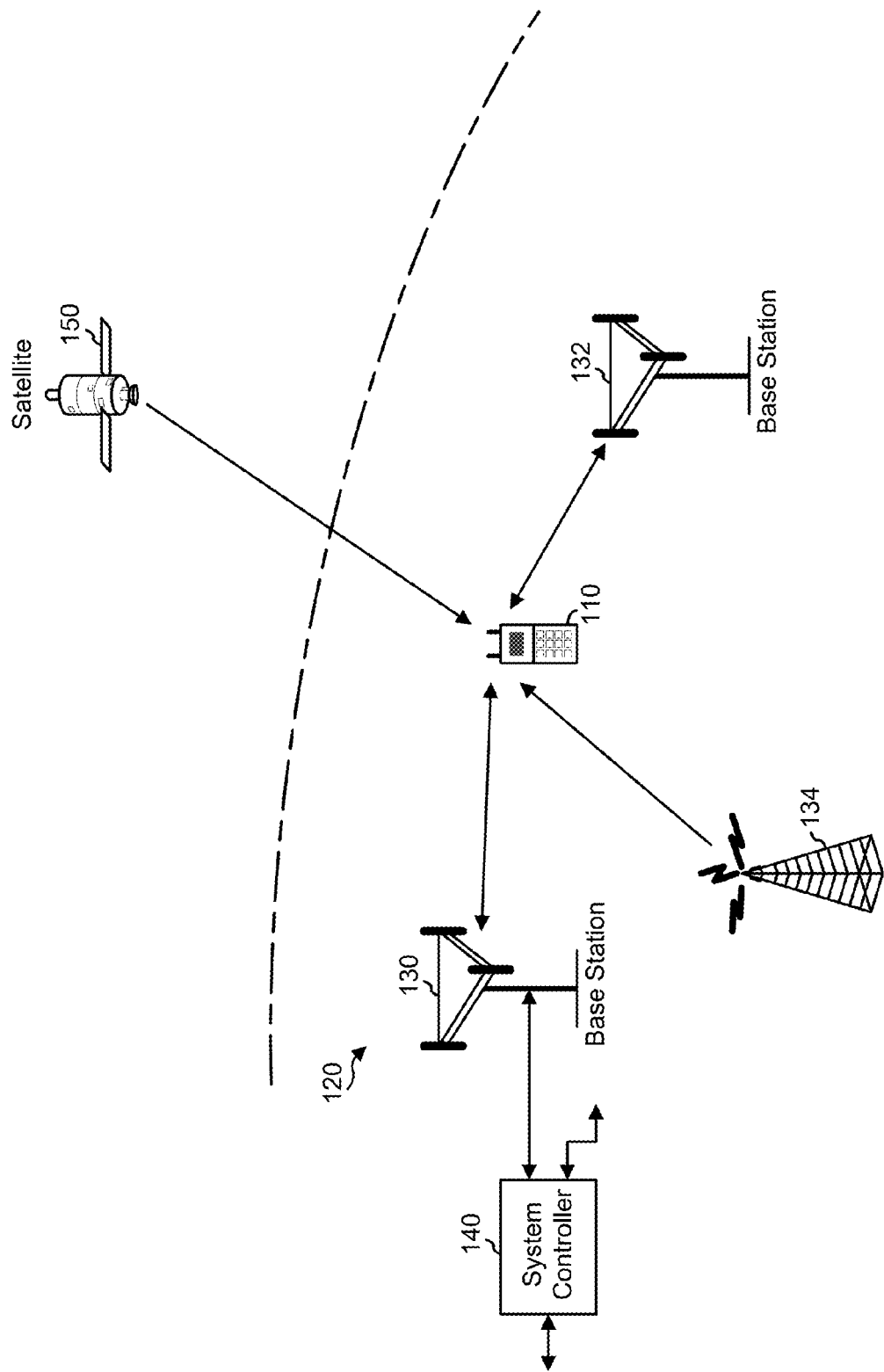
FIG. 1 shows a wireless device communicating with a wireless communication system, in accordance with some exemplary embodiments.

FIG. 1 shows a wireless device 110 communicating with a wireless communication system 120, in accordance with some exemplary embodiments. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Figure 2:
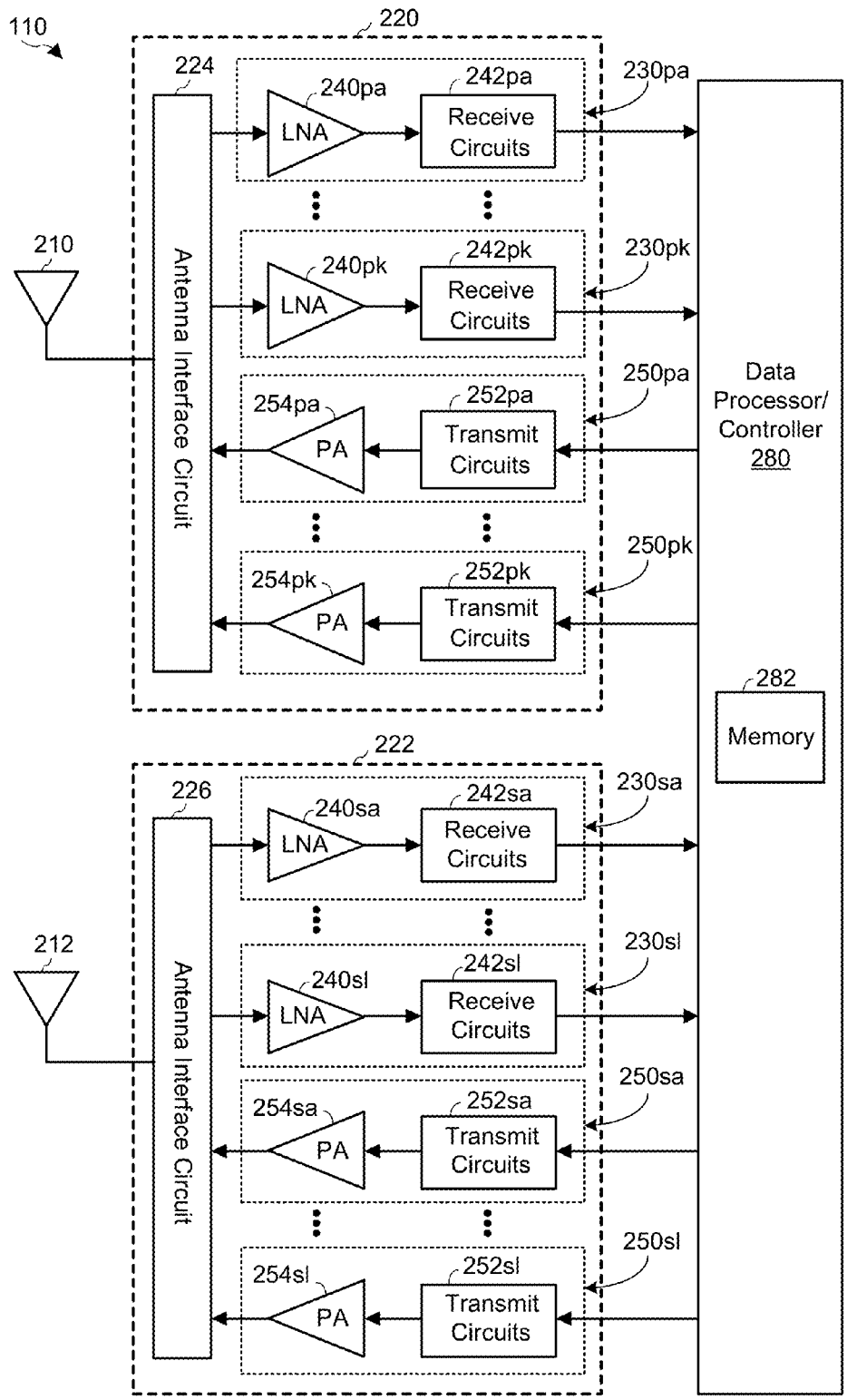
FIG. 2 shows an exemplary design of a receiver and a transmitter of FIG. 1.

FIG. 2 shows a block diagram of an exemplary design of wireless device 110 in FIG. 1. In this exemplary design, wireless device 110 includes a primary transceiver 220 coupled to a primary antenna 210, a secondary transceiver 222 coupled to a secondary antenna 212, and a data processor/controller 280. Primary transceiver 220 includes a number (K) of receivers 230pa to 230pk and a number (K) of transmitters 250pa to 250pk to support multiple frequency bands, multiple radio technologies, carrier aggregation, etc. Secondary transceiver 222 includes a number (L) of receivers 230sa to 230sl and a number (L) of transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes a low noise amplifier (LNA) 240 and receive circuits 242. For data reception, primary antenna 210 receives signals from base stations and/or other transmitter stations and provides a received radio frequency (RF) signal, which is routed through an antenna interface circuit 224 and presented as an input RF signal to a selected receiver. Antenna interface circuit 224 may include switches, duplexers, transmit filters, receive filters, matching circuits, etc. The description below assumes that receiver 230pa is the selected receiver. Within receiver 230pa, an LNA 240pa amplifies the input RF signal and provides an output RF signal. Receive circuits 242pa downconvert the output RF signal from RF to baseband, amplify and filter the downconverted signal, and provide an analog input signal to data processor/controller 280. Receive circuits 242pa may include mixers, filters, amplifiers, matching circuits, an oscillator, a local oscillator (LO) generator, a phase locked loop (PLL), etc. Each remaining receiver 230 in transceivers 220 and 222 may operate in similar manner as receiver 230pa.

In the exemplary design shown in FIG. 2, each transmitter 250 includes transmit circuits 252 and a power amplifier (PA) 254. For data transmission, data processor/controller 280 processes (e.g., encodes and modulates) data to be transmitted and provides an analog output signal to a selected transmitter. The description below assumes that transmitter 250pa is the selected transmitter. Within transmitter 250pa, transmit circuits 252pa amplify, filter, and upconvert the analog output signal from baseband to RF and provide a modulated RF signal. Transmit circuits 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal is routed through antenna interface circuit 224 and transmitted via primary antenna 210. Each remaining transmitter 250 in transceivers 220 and 222 may operate in similar manner as transmitter 250pa.

Each receiver 230 and transmitter 250 may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 within transceivers 220 and 222 may be implemented on multiple IC chips, as described below. The circuits in transceivers 220 and 222 may also be implemented in other manners.

Data processor/controller 280 may perform various functions for wireless device 110. For example, data processor/controller 280 may perform processing for data being received via receivers 230 and data being transmitted via transmitters 250. Data processor/controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Figure 3:
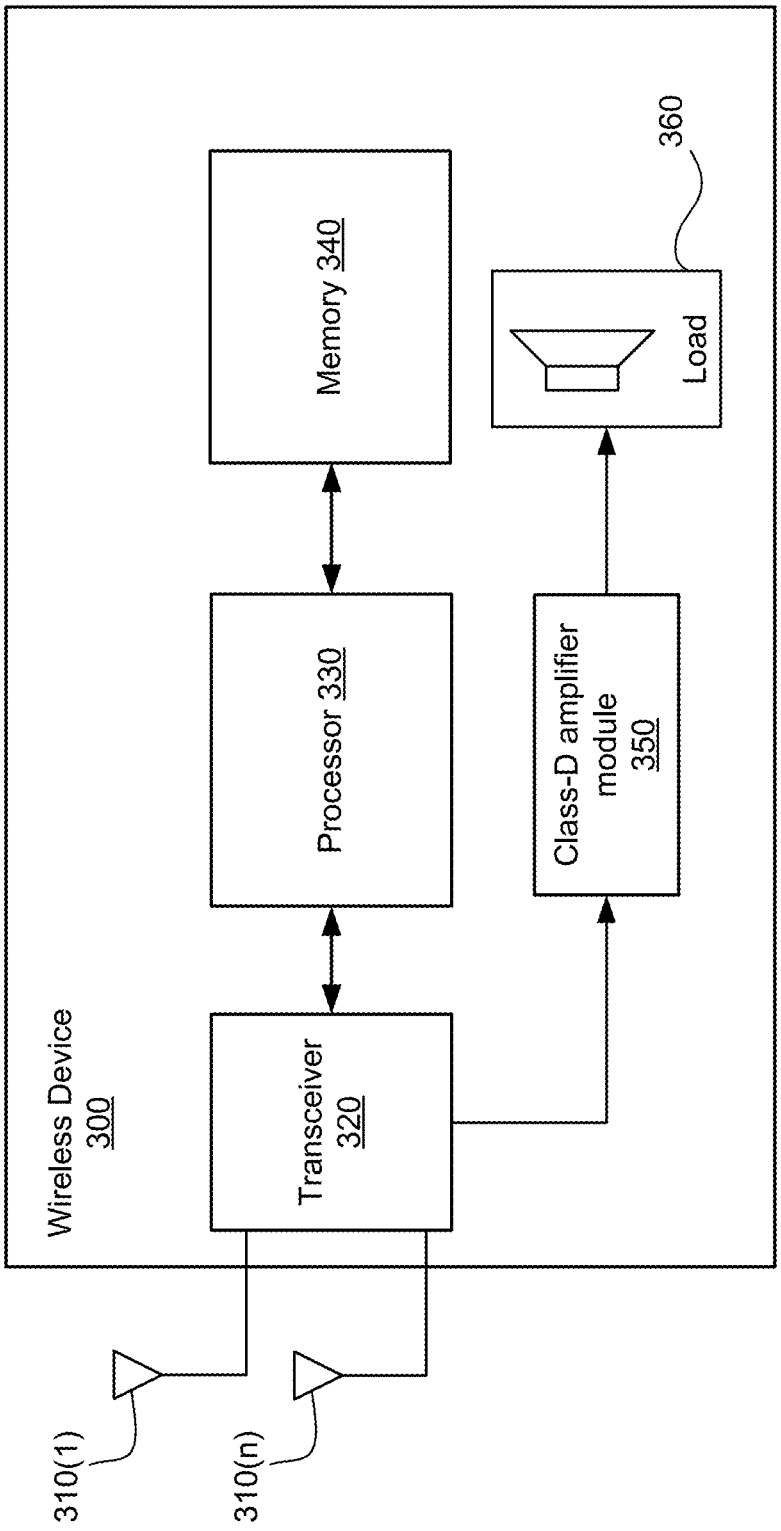
FIG. 3 shows a wireless device that is one exemplary embodiment of the wireless device of FIG. 2.

FIG. 3 shows a wireless device 300 that is one exemplary embodiment of the wireless device 110 of FIG. 2. Wireless device 300 may include a plurality of antennas 310(1)-310(n), a transceiver 320, a processor 330, a class-D amplifier module 350, a load 360, and a memory 340. Transceiver 320 may be one exemplary embodiment of primary transceiver 220 or secondary transceiver 222 of FIG. 2. Transceiver 320 may be coupled to antennas 310(1)-310(n), either directly or through an antenna selection circuit (not shown for simplicity). Transceiver 320 may be used to transmit signals and receive signals from other wireless devices. Although not shown in FIG. 3, the transceiver 320 may include any number of transmit chains to process and transmit signals to other wireless devices via antennas 310(1)-310(n), and may include any number of receive chains to process signals received from antennas 310(1)-310(n). Thus, for exemplary embodiments, the wireless device 300 may be configured for multiple-input, multiple-output (MIMO) operations. The MIMO operations may include single-user MIMO (SU-MIMO) operations and multi-user MIMO (MU-MIMO) operations.

Memory 340, coupled to processor 330, may include a non-transitory computer-readable storage medium (e.g., one or more nonvolatile memory elements, such as EPROM, EEPROM, Flash memory, a hard drive, etc.) that may store software modules to control transceiver 320 and/or class-D amplifier module 350. For example, processor 330 may execute a software module that causes class-D amplifier module 350 to amplify a signal received from transceiver 320 and may provide the amplified signal to load 360. The amplified signal may include amplified PWM signals and/or amplified differential PWM signals. In some exemplary embodiments, load 360 may be speaker, for example, when the amplified signal is an audio signal. In other exemplary embodiments, load 360 may be any technically feasible load to receive an amplified signal from class-D amplifier module 350.

Figure 4A:
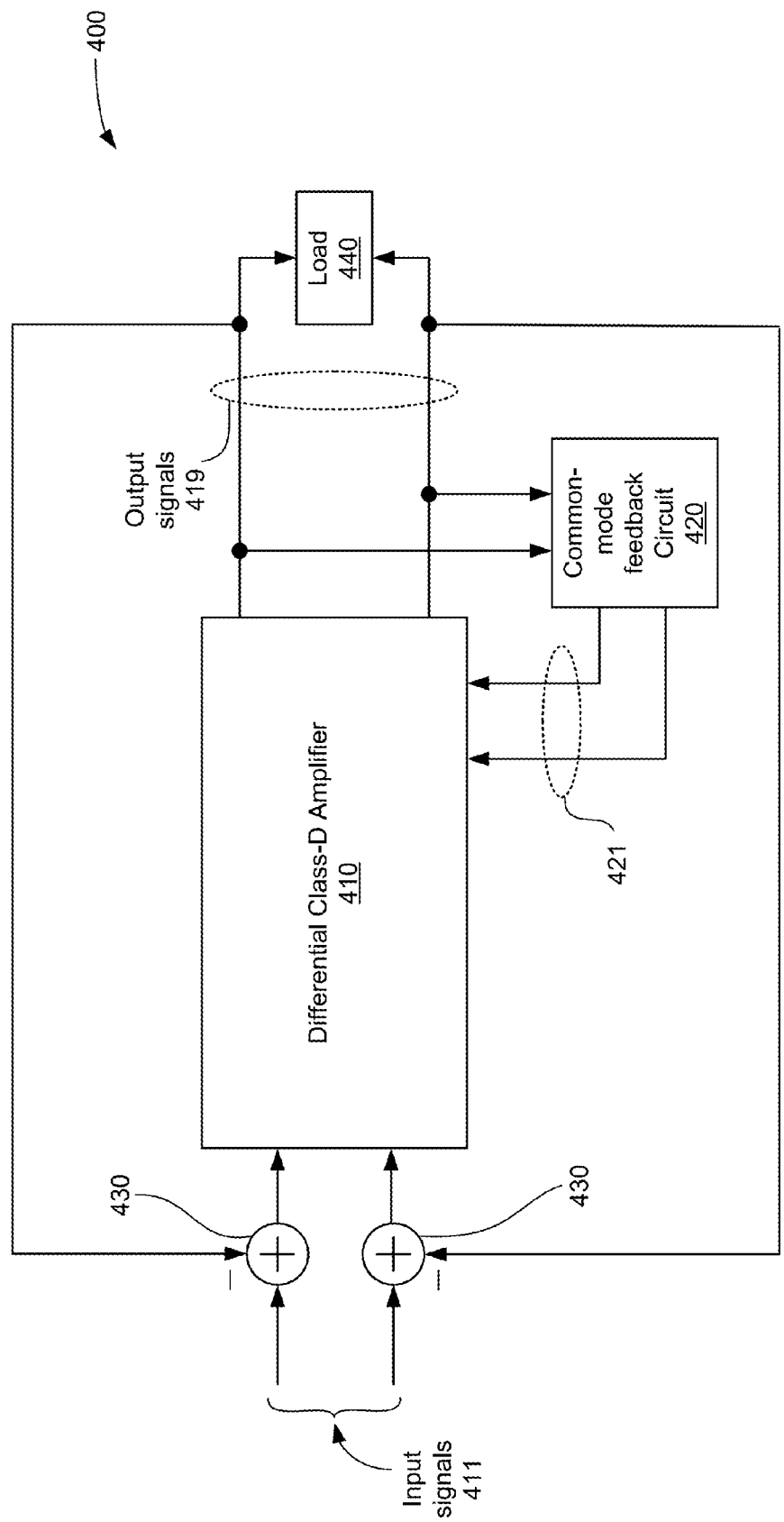
FIG. 4A is a block diagram of a first exemplary embodiment of the class-D amplifier module of FIG. 3.

FIG. 4A is a block diagram 400 of a first exemplary embodiment of class-D amplifier module 350 of FIG. 3. Class-D amplifier module 350 may include a differential class-D amplifier 410 and a common-mode feedback circuit 420. Differential class-D amplifier 410 may receive differential input signals 411 and may generate differential PWM output signals 419.

The differential PWM output signals 419 may be provided to a load 440. Load 440 may be another exemplary embodiment of load 360 of FIG. 3. Load 440 may be a resistive, inductive, and/or capacitive load. In some exemplary embodiments, load 440 may operate to low-pass filter the differential PWM output signals 419. One example of load 440 may be a speaker within or otherwise associated with wireless device 110. The differential PWM output signals 419 may also be provided to common-mode feedback circuit 420. In some exemplary embodiments, common-mode feedback circuit 420 may determine a common-mode output voltage of the differential PWM output signals 419 and may compare the common-mode output voltage to a reference voltage. Common-mode feedback circuit 420 may generate differential correction signals 421 to control the common-mode output voltage of the differential PWM output signals 419. Thus, in some exemplary embodiments, common-mode feedback circuit 420 may operate as a differential correction circuit by receiving output signals (e.g., differential PWM output signals 419) and generating differential correction signals (e.g., differential correction signals 421). The differential correction signals 421 may be provided to differential class-D amplifier 410 through differential input terminals. Differential class-D amplifier 410 may control the common-mode output voltage based on the differential correction signals 421. In some exemplary embodiments, differential PWM output signals 419 may be fed back to inputs of the differential class-D amplifier 410. For example, differential PWM output signals 419 may be coupled to one or more summing nodes 430 and may be subtracted from differential input signals 411.

In some exemplary embodiments, differential class-D amplifier 410 may include a plurality of modules, such as a plurality of integration and gain stages. Possible exemplary embodiments of differential class-D amplifier 410 are described in more detail below in conjunction with FIGS. 4B-4D.

Figure 4B:
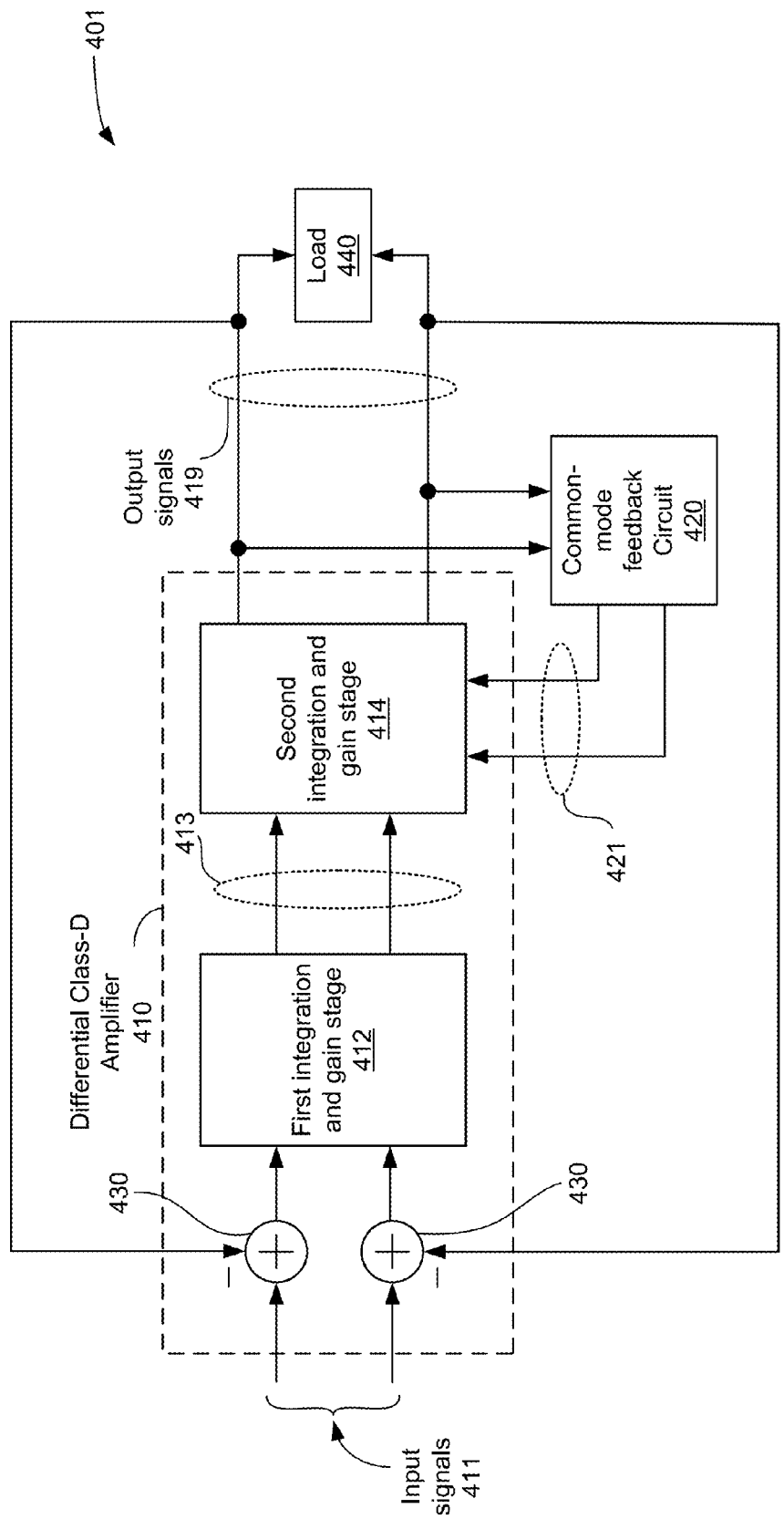
FIG. 4B is a block diagram of a second exemplary embodiment of the class-D amplifier module of FIG. 3.

FIG. 4B is a block diagram 401 of a second exemplary embodiment of class-D amplifier module 350 of FIG. 3. Similar to the first exemplary embodiment depicted in FIG. 4A, block diagram 401 may include differential class-D amplifier 410 and common-mode feedback circuit 420. Differential class-D amplifier 410 may receive differential input signals 411 and may generate differential PWM output signals 419. In some exemplary embodiments, differential class-D amplifier 410 may include a first integration and gain stage 412 and a second integration and gain stage 414. Each integration and gain stage 412 and 414 may integrate at least a portion of the differential input signals 411 and may provide a predetermined amount of processing gain. In other exemplary embodiments, each integration and gain stage 412 and 414 may be replaced by a plurality of gain stages. Although only two stages are shown in FIG. 4B, in other exemplary embodiments, differential class-D amplifier 410 may have other numbers of stages.

In some exemplary embodiments, cascading the first integration and gain stage 412 and the second integration and gain stage 414 may increase isolation between the differential input signals 411 and the differential PWM output signals 419. For example, the first integration and gain stage 412 may provide an initial amount of gain for the differential input signals 411 while operating to reject noise associated with components (e.g., resistors, capacitors, transistors, etc.) within the first integration and gain stage 412 and/or reject noise associated with sources outside the differential class-D amplifier 410. The second integration and gain stage 414 may provide additional gain to intermediate output signals 413 provided by the first integration and gain stage 412. In some exemplary embodiments, the second integration and gain stage 414 may integrate one or more square wave signals to generate one or more triangle wave signals. The one or more triangle wave signals may be used to generate the differential PWM output signals 419.

Similar to the first exemplary embodiment depicted in FIG. 4A, differential PWM output signals 419 may be provided to a load 440 and also to common-mode feedback circuit 420. As described with respect to FIG. 4A, common-mode feedback circuit 420 may determine the common-mode output voltage of the differential PWM output signals 419 and may compare the common-mode output voltage to a reference voltage. Common-mode feedback circuit 420 may generate differential correction signals 421 to control the common-mode output voltage of the differential PWM output signals 419. In some exemplary embodiments, the differential correction signals 421 may be provided to the second integration and gain stage 414 through differential input terminals. Thus, second integration and gain stage 414 may control the common-mode output voltage of the differential PWM output signals based on the differential correction signals 421. Differential PWM output signals 419 may be fed back to inputs of the differential class-D amplifier 410 through one or more summing nodes 430.

Figure 4C:
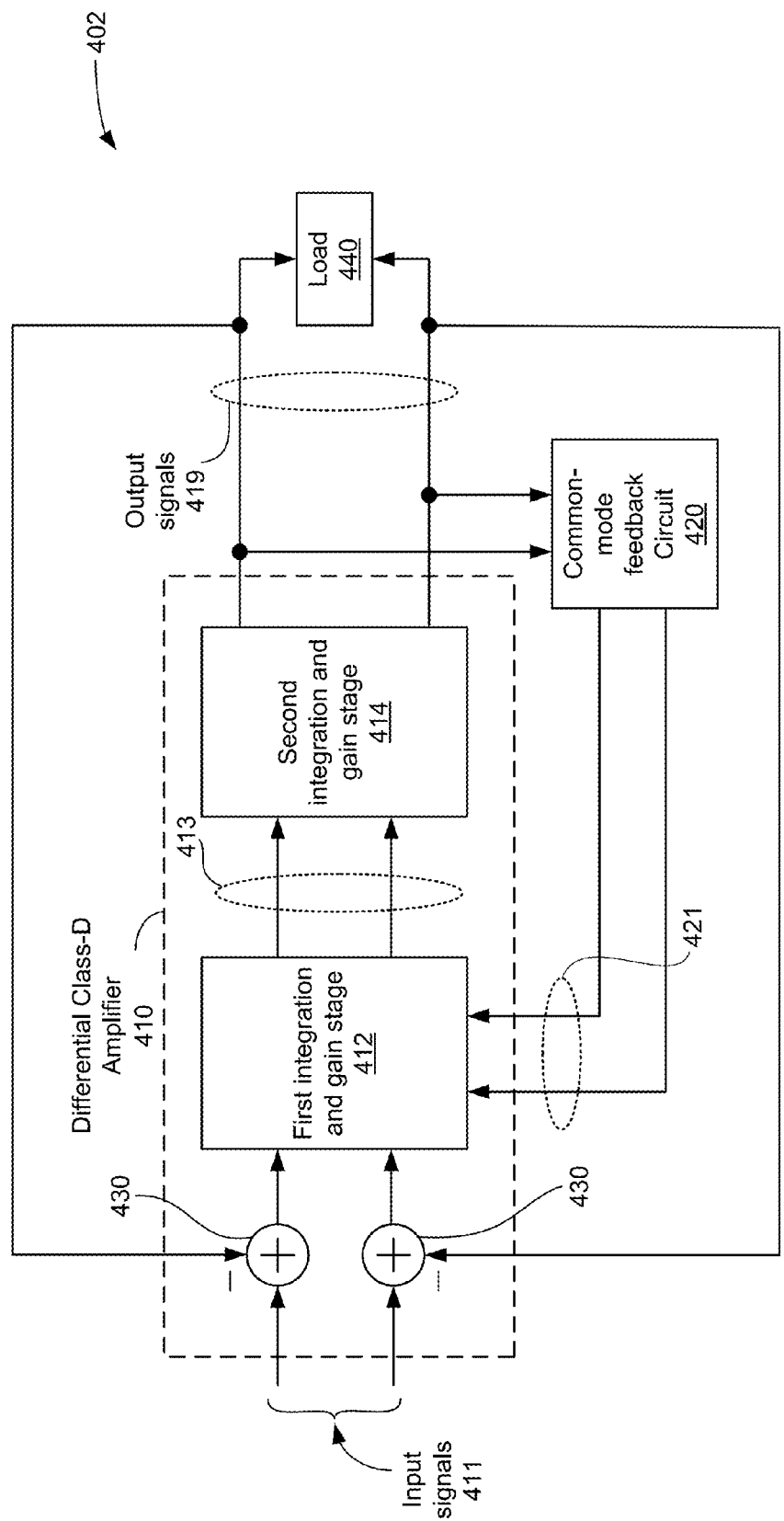
FIG. 4C is a block diagram of a third exemplary embodiment of the class-D amplifier module of FIG. 3.

FIG. 4C is a block diagram 402 of a third exemplary embodiment of class-D amplifier module 350 of FIG. 3. Similar to the first exemplary embodiment depicted in FIG. 4A, block diagram 402 may include differential class-D amplifier 410 and common-mode feedback circuit 420. Differential class-D amplifier 410 may include the first integration and gain stage 412 and the second integration and gain stage 414. The differential class-D amplifier 410, the first integration and gain stage 412, and the second integration and gain stage 414 may operate in a similar manner as described above with respect to FIG. 4B.

Similar to the exemplary embodiments depicted in FIGS. 4A and 4B, differential PWM output signals 419 may be provided to a load 440 and also to common-mode feedback circuit 420. Common-mode feedback circuit 420 may generate differential correction signals 421 to control the common-mode output voltage of the differential PWM output signals 419 based on the common-mode output voltage of the differential PWM output signals and a reference voltage. In some exemplary embodiments, the differential correction signals 421 may be provided to the first integration and gain stage 412 through differential input terminals. Thus, first integration and gain stage 412 may control the common-mode output voltage of the differential PWM output signals 419 through intermediate output signals 413. Differential PWM output signals 419 may be fed back to inputs of the differential class-D amplifier 410 through one or more summing nodes 430.

Figure 4D:
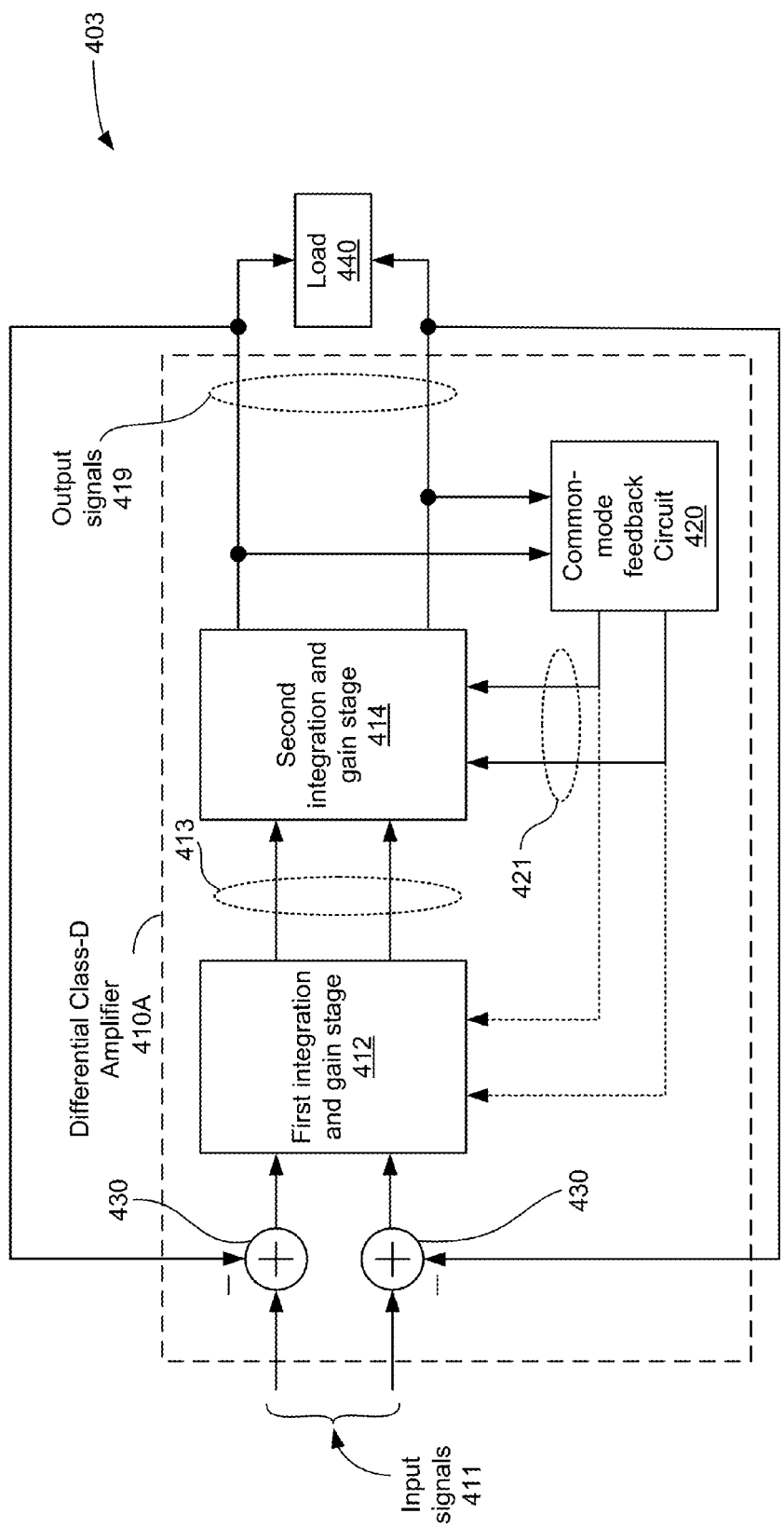
FIG. 4D is a block diagram of a fourth exemplary embodiment of the class-D amplifier module of FIG. 3

FIG. 4D is a block diagram 403 of a fourth exemplary embodiment of class-D amplifier module 350 of FIG. 3. Class-D amplifier module 350 may include differential class-D amplifier 410A. Differential class-D amplifier 410A may include first integration and gain stage 412, second integration and gain stage 414, and common-mode feedback circuit 420. Thus, in some exemplary embodiments, differential class-D amplifier 410A may include similar modules as described with respect to the differential class-D amplifier 410 of FIGS. 4B-4C and also the common-mode feedback circuit 420. Operation of first integration and gain stage 412, second integration and gain stage 414, and common-mode feedback circuit 420 may be similar to operations described with respect to FIG. 4B and/or FIG. 4C.

Differential correction signals 421 may be coupled to first integration and gain stage 412 (shown with dotted lines) and/or second integration and gain stage 414 (shown with solid lines). First integration and gain stage 412 and/or second integration and gain stage 414 may control the common-mode output voltage of the differential PWM output signals 419 based on the differential correction signals 421 as described above with respect to FIGS. 4B and 4C.

The exemplary embodiments depicted in FIGS. 4A-4D are meant to show possible implementations of the class-D amplifier module 350 and are not meant to be exhaustive or limiting. For example, other arrangements and/or numbers of integration and gain stages within differential class-D amplifier 410 are possible. Operations of differential class-D amplifier 410 and common-mode feedback circuit 420 are described in more detail below in conjunction with FIGS. 5-8.

Figure 5:
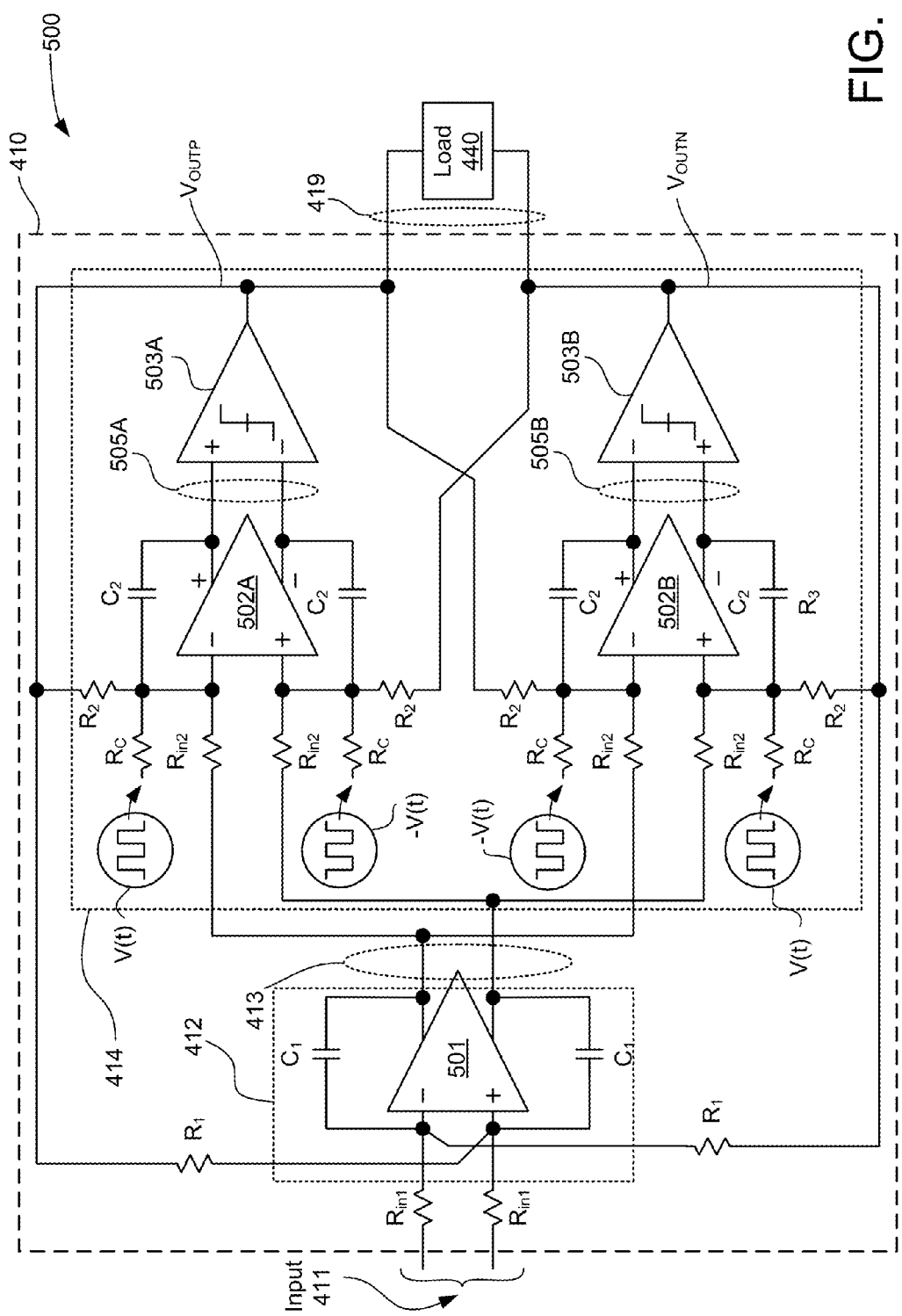
FIG. 5 is an exemplary circuit diagram of the differential class-D amplifier of FIGS. 4B-4C, in accordance with exemplary embodiments.

FIG. 5 is an exemplary circuit diagram 500 of the differential class-D amplifier 410 depicted in FIGS. 4B-4C, in accordance with exemplary embodiments. The differential class-D amplifier 410 may receive differential input signals 411 and may generate differential PWM output signals 419. In some exemplary embodiments, differential PWM output signals 419 may include a first signal $V_{OUTP}$ and a second signal $V_{OUTN}$. In other exemplary embodiments, differential PWM output signals 419 may include different signals and/or different numbers of signals. The differential PWM output signals 419 may be provided to load 440.

The differential class-D amplifier 410 may include a first differential amplifier 501, second differential amplifiers 502A and 502B, and comparators 503A and 503B. In some exemplary embodiments, the first differential amplifier 501 may operate as the first integration and gain stage 412 of FIGS. 4B-4C (shown as a dotted box 412 in FIG. 5). Second differential amplifiers 502A and 502B and comparators 503A and 503B may operate as second integration and gain stage 414 of FIGS. 4B-4C (shown as dotted box 414 in FIG. 5).

Differential input signals 411 may be provided through input resistors $R_{in1}$ to first differential amplifier 501. Capacitors $C_1$ may provide feedback signals by coupling output terminals to input terminals of first differential amplifier 501. In some exemplary embodiments, first differential amplifier 501 may integrate differential input signals 411 via a time-dependent behavior based on capacitors $C_1$ and input resistors $R_{in1}$ to generate intermediate output signals 413. A transfer function $H_1(s)$ describing a ratio of output signals (e.g., intermediate output signals 413) to input signals (e.g., differential input signals 411) associated with first differential amplifier 501 may be expressed by equation 1, shown below:

$$H_1(s) = \frac{1}{sC_1 R_{in1}} \quad \text{(eq. 1)}$$

Output signals from first differential amplifier 501 (e.g., intermediate output signals 413) may be provided to second differential amplifiers 502A and 502B via resistors $R_{in2}$. Capacitors C2 may provide feedback signals by coupling output terminals to input terminals of the second differential amplifiers 502A and 502B, as depicted in FIG. 5. In some exemplary embodiments, the second differential amplifiers 502A and 502B may integrate signals at their respective input terminals via a time-dependent behavior based on capacitors $C_2$ and input resistors $R_{in2}$ Second differential amplifiers 502A and 502B may generate second differential amplifier output signals 505A and 505B, respectively. A transfer function $H_2(s)$ describing a ratio of output signals (e.g., second differential amplifier output signals 505A and 505B) to input signals (e.g., intermediate output signals 413) associated with second differential amplifiers 502A and 502B may be expressed by equation 2, shown below:

$$H_2(s) = \frac{1}{sC_2 R_{in2}} \quad \text{(eq. 2)}$$

Signal generators that may provide a periodic square wave signal may also be coupled to input terminals of the second differential amplifiers 502A and 502B. As the periodic square wave signals are integrated (e.g., described by equation 2), the resulting triangle wave signals may be used to determine output signals for the second differential amplifiers 502A and 502B. In some exemplary embodiments, the triangle wave signals may be used to determine differential PWM output signals 419 provided by comparators 503A and 503B. As shown, a periodic square wave signal (denoted as V(t) in FIG. 5) may be provided to an inverting input (e.g., a first differential input terminal) of second differential amplifier 502A through resistor $R_C$. A complementary periodic square wave signal (denoted as −V(t) in FIG. 5) may be provided to a non-inverting input (e.g., a second differential input terminal) of second differential amplifier 502A through another resistor $R_C$.

In a similar manner, the periodic square wave signal may be provided to the non-inverting input terminal of second differential amplifier 502B, and the complementary periodic square wave signal may be provided to the inverting input terminal of second differential amplifier 502B. A transfer function $H_3(s)$ describing a ratio of output signals (e.g., second differential amplifier output signals 505A and 505B) to input signals (e.g., square wave signals V(t) and −V(t)) associated with second differential amplifiers 502A and 502B may be expressed by equation 3, shown below:

$$H_3(s) = \frac{1}{sC_2R_C} \qquad \text{(eq. 3)}$$

The second differential amplifier output signals 505A and 505B may be provided to comparators 503A and 503B, respectively. The comparators 503A and 503B may generate the differential PWM output signals 419 for the differential class-D amplifier 410. In some exemplary embodiments, the comparators 503A and 503B may include switching transistors to drive the differential PWM output signals 419. As shown, the differential PWM output signals 419 may be provided to the load 440.

In some exemplary embodiments, signals associated with load 440 may be provided to the input terminals of the second differential amplifiers 502A and 502B through resistors $R_2$. A transfer function $H_4(s)$ describing a ratio of output signals (e.g., second differential amplifier output signals 505A and 505B) to input signals (e.g., signals associated with load 440) associated with second differential amplifiers 502A and 502B may be expressed by equation 4, shown below:

$$H_4(s) = \frac{1}{sC_2R_2} \qquad \text{(eq. 4)}$$

Figure 6:
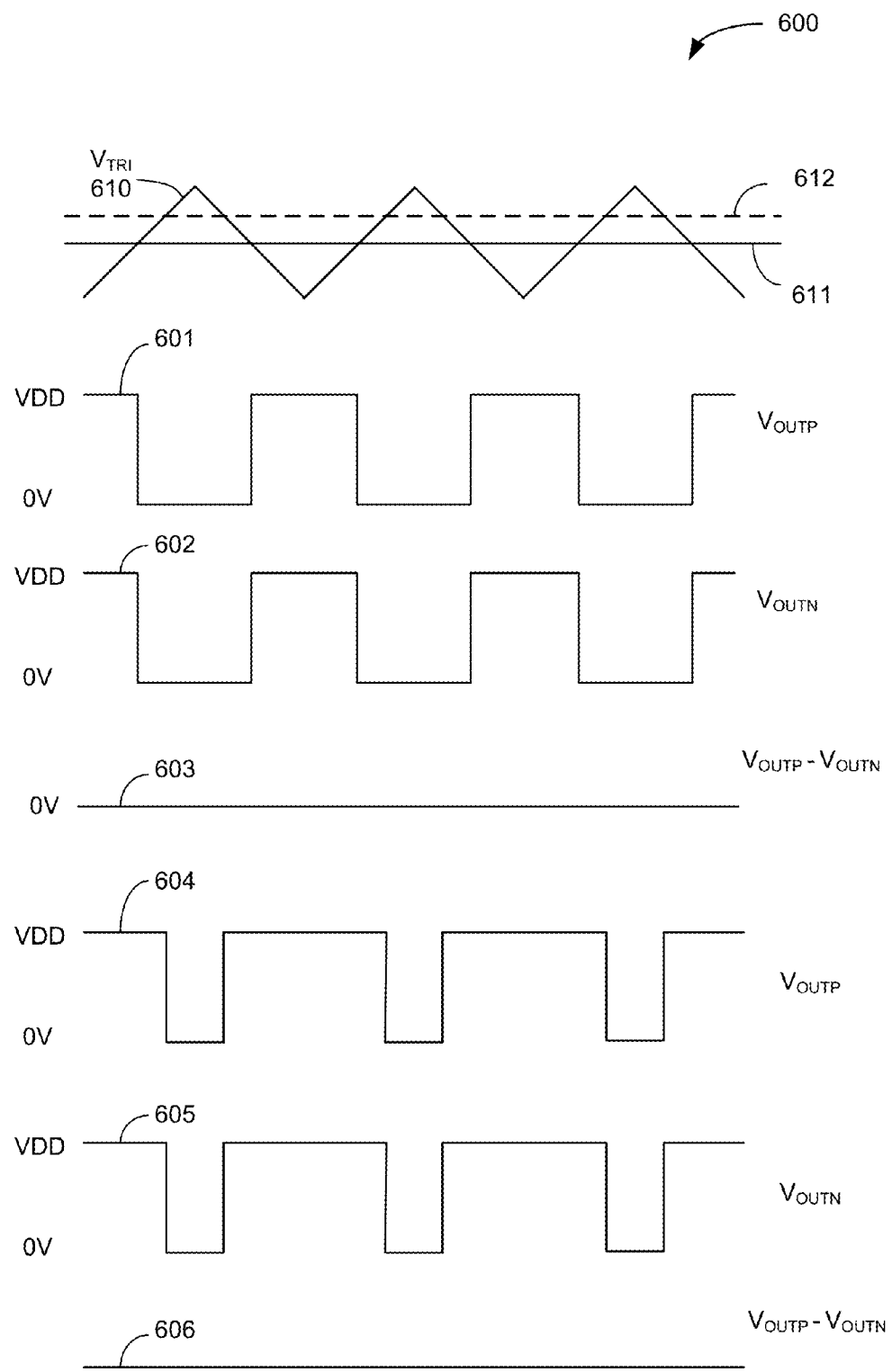
FIG. 6 is a waveform diagram of waveforms that may be associated with the differential class-D amplifier of FIG. 5.

FIG. 6 is a waveform diagram 600 of waveforms that may be associated with differential class-D amplifier 410. $V_{TRI}$ 610 is a triangle wave signal that may result from an integration of a square wave signal (e.g., V(t) and/or −V(t)). An input signal (such as intermediate output signal 413, not shown here for simplicity) may be compared to the triangle wave signal to generate second differential amplifier output signals 505A and 505B, and therefore $V_{OUTP}$ and $V_{OUTN}$ (e.g., differential PWM output signals 419).

In some exemplary embodiments, an ideal common-mode voltage of differential PWM output signals 419 may be approximately half way between power supply voltages associated with differential class-D amplifier 410. If the common-mode voltage of the differential PWM output signals 419 is approximately equal to the ideal common-mode voltage, signal distortion associated with differential class-D amplifier 410 may be substantially reduced. Differential PWM output signals 419 having a common-mode voltage near the ideal common-mode voltage are described below with respect to signals 601-603. On the other hand, if the common-mode voltage of the differential PWM output signals 419 is different from the ideal common-mode voltage, signal distortion may increase, even when the differential PWM output signals 419 are otherwise accurate. Differential PWM output signals 419 having a common-mode voltage different from the ideal common-mode voltage are described below with respect to signals 604-606.

In a first exemplary embodiment, differential input signals 411 may be quiescent and an associated difference between the differential input signals 411 may be approximately 0V. Example quiescent differential input signals 611 are displayed with $V_{TRI}$ 610 in FIG. 6. Since quiescent differential input signals 611 may be half-way between highest and lowest voltage excursions of $V_{TRI}$ 610, the resulting differential PWM output signals 419 (based upon a comparison between quiescent differential input signals 611 and $V_{TRI}$ 610) may have a 50% duty cycle as shown by a first signal $V_{OUTP}$ 601 and a second signal $V_{OUTN}$ 602.

The differential output based on first signal $V_{OUTP}$ 601 and second signal $V_{OUTN}$ 602 may be 0V, depicted by first $V_{OUTP}$-$V_{OUTN}$ signal 603. Thus, differential PWM output signals 419 (e.g., first $V_{OUTP}$-$V_{OUTN}$ signal 603) may reflect the quiescent differential input signals 611. In this exemplary embodiment, the 50% duty cycles of first signal $V_{OUTP}$ 601 and second signal $V_{OUTN}$ 602 may provide a common-mode voltage near an ideal common-mode voltage.

In a second exemplary embodiment, quiescent differential input signals 611 may again be received by differential class-D amplifier 410. However, because of one or more differences associated with second differential amplifiers 502A and 502B (e.g., offset voltages), third signal $V_{OUTP}$ 604 and fourth signal $V_{OUTN}$ 605 may not have a 50% duty cycle. In some exemplary embodiments, the differences associated with second differential amplifiers 502A and 502B may appear to offset quiescent differential input signals 611 to offset input signals 612. The associated differential output based on third signal $V_{OUTP}$ 604 and fourth signal $V_{OUTN}$ 605 may again be 0V, depicted by second $V_{OUTP}$-$V_{OUTN}$ signal 606.

Note that in this exemplary embodiment, third signal $V_{OUTP}$ 604 and fourth signal $V_{OUTN}$ 605 may have a duty cycle of approximately 66% (e.g., outputs may be VDD 66% of the time and 0V 34% of the time). Offset input signals 612 may cause $V_{OUTP}$ and $V_{OUTN}$ to switch together at duty cycles other than 50% while still providing differential PWM output signals 419 that may reflect the quiescent differential input signals 611. Thus, the common mode voltage of the differential PWM output signals 419 may be offset with respect to the ideal common-mode voltage described above. In extreme cases, $V_{OUTP}$ and $V_{OUTN}$ may be stuck at VDD or 0V. Thus, although the resulting $V_{OUTP}$-$V_{OUTN}$ signal may be accurate, distortion such as clipping may result.

Figure 7:
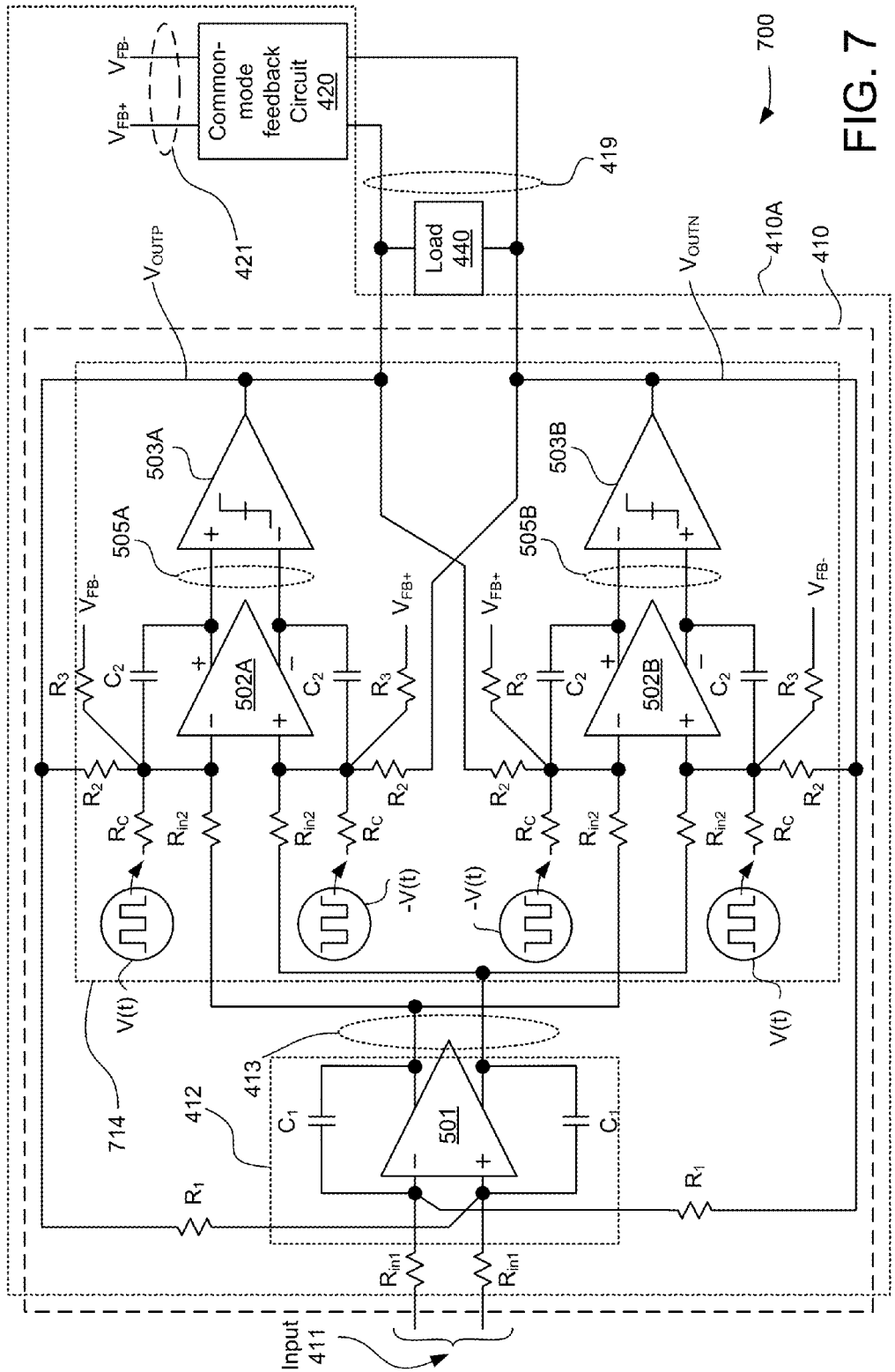
FIG. 7 is an exemplary circuit diagram of the differential class-D amplifier and the common-mode feedback circuit of FIG. 4, in accordance with exemplary embodiments

FIG. 7 is an exemplary circuit diagram 700 of differential class-D amplifier 410 and common-mode feedback circuit 420 of FIGS. 4A-4C, in accordance with exemplary embodiments. Differential class-D amplifier 410 may include first integration and gain stage 412 and a second integration and gain stage 714. First integration and gain stage 412 may be substantially similar to exemplary embodiments described with respect to FIGS. 4 and 5 above. Second integration and gain stage 714 may be another exemplary embodiment of, and share similar elements with, second integration and gain stage 414 described with respect to FIGS. 4 and 5 above. Similarly numbered elements within second integration and gain stage 414 and second integration and gain stage 714 may be substantially similar. For example, both second integration and gain stage 414 and second integration and gain stage 714 may include second differential amplifiers 502A and 502B coupled to comparators 503A and 503B.

The common-mode feedback circuit 420 may be coupled to the differential PWM output signals 419. The common-mode feedback circuit 420 may monitor (e.g., sense) the differential PWM output signals 419 and may provide feedback signals to control a common-mode voltage of the differential PWM output signals 419. For example, common-mode feedback circuit 420 may generate differential correction signals 421 (e.g., feedback signals) that may, in turn, be provided to second differential amplifiers 502A and 502B through resistors $R_3$. Resistors $R_3$ may be coupled to differential input terminals of second differential amplifiers 502A and 502B. A transfer function $H_5(s)$ describing a ratio of output signals (e.g., second differential amplifier output signals 505A and 505B) to input signals (e.g., differential correction signals 421) may be expressed by equation 5, shown below:

$$H_5(s) = \frac{1}{sC_2R_3} \qquad \text{(eq. 5)}$$

In some exemplary embodiments, the input terminals of the second differential amplifiers 502A and 502B may operate as summing nodes. Thus, some or all of transfer functions $H_2(s)$-$H_5(s)$ may be combined to determine, at least in part, output behavior of the second differential amplifiers 502A and 502B. In a similar manner, some of all of transfer functions $H_1(s)$-$H_5(s)$ may be combined to determine an overall output behavior of differential class-D amplifier 410.

Note that the differential correction signals 421 are differentially coupled to the second integration and gain stage 714 via second differential amplifiers 502A and 502B. Thus, fully differential signal processing is provided by differential class-D amplifier 410. For example, differential input signals 411 are processed by first differential amplifier 501, second differential amplifiers 502A and 502B, and comparators 503A and 503B to generate the differential PWM output signal 419. The signal processing provided within differential class-D amplifier 410 is substantially differential; single-ended signal processing is avoided.

In some exemplary embodiments, differential class-D amplifier 410A (shown as a dotted box) may include similar circuits as described above with respect to differential class-D amplifier 410 and may also include common-mode feedback circuit 420. In some exemplary embodiments, common-mode feedback circuit 420 may generate differential correction signals 421 to control the common-mode voltage of the class-D differential output signals through a number of approaches. Some possible approaches are described in detail below in conjunction with FIGS. 8A-8C.

Figure 8A:
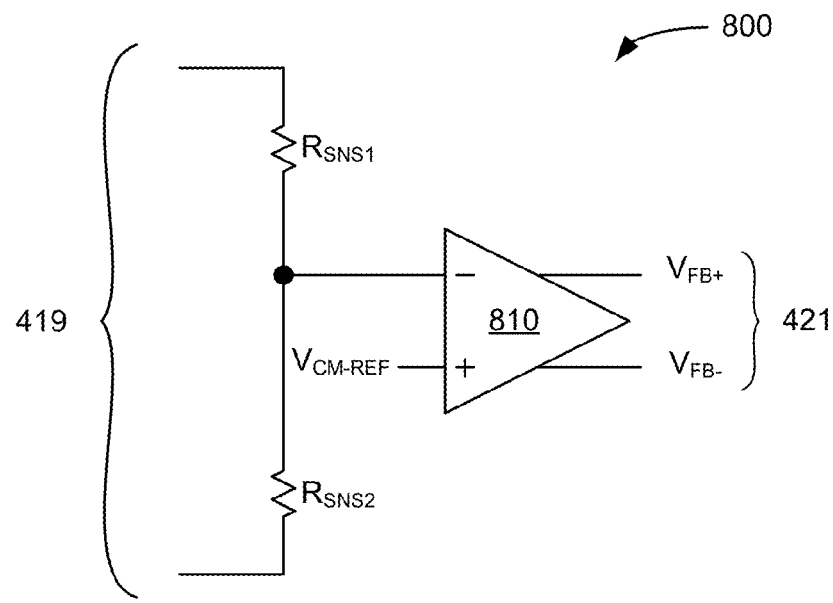
FIG. 8A is a circuit diagram of a first exemplary embodiment of the correction circuit of FIG. 7.

FIG. 8A is a circuit diagram of a first exemplary embodiment 800 of common-mode feedback circuit 420 of FIG. 5. The first exemplary embodiment 800 may include a differential amplifier 810 and sense resistors $R_{SNS1}$ and $R_{SNS2}$. In some exemplary embodiments, the differential PWM output signals 419 may be provided to sense resistors $R_{SNS1}$ and $R_{SNS2}$, which may be configured as a voltage divider. When values of both sense resistors $R_{SNS1}$ and $R_{SNS2}$ are substantially equal (e.g., $R_{SNS}$), a common-mode voltage of the differential PWM output signals 419 may be determined and coupled to an inverting input terminal of differential amplifier 810.

A non-inverting input terminal of differential amplifier 810 may be coupled to a common-mode reference voltage (e.g., $V_{CM\text{-}REF}$). The common-mode reference voltage $V_{CM\text{-}REF}$ may be a target (e.g., desired) common-mode voltage for the differential PWM output signals 419, and may be provided by a reference diode, a regulated power supply, a band-gap reference, or any other technically feasible means for generating a stable reference voltage.

Differential amplifier 810 may generate differential correction signals 421 based on the common-mode reference voltage $V_{CM\text{-}REF}$ and the common-mode voltage of the differential PWM output signals 419. In some exemplary embodiments, differential amplifier 810 may operate as a common-mode feedback amplifier. The differential correction signals 421 may control the common-mode voltage of the differential PWM output signals 419 via second differential amplifiers 502A and 502B (see FIG. 7).

Figure 8B:
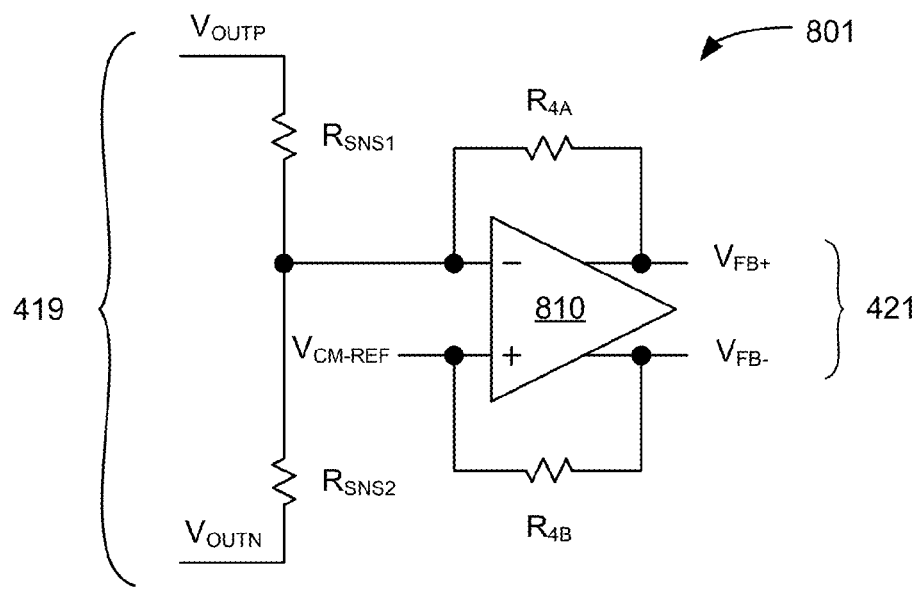
FIG. 8B is a circuit diagram of a second exemplary embodiment of the correction circuit of FIG. 7.

FIG. 8B is a circuit diagram of a second exemplary embodiment 801 of common-mode feedback circuit 420 of FIG. 5. Similar to the first exemplary embodiment 800 of FIG. 8A, second exemplary embodiment 801 includes differential amplifier 810 and sense resistors $R_{SNS1}$ and $R_{SNS2}$ that may be configured as a voltage divider to determine the common-mode voltage of the differential PWM output signals 419. The common-mode voltage of the differential PWM output signals 419 may be coupled to an inverting input terminal of differential amplifier 810. A common-mode reference voltage $V_{CM\text{-}REF}$ may be coupled to the non-inverting input of differential amplifier 810.

Differential amplifier 810 may generate differential correction signals 421 based on the common-mode reference voltage $V_{CM\text{-}REF}$ and the common-mode voltage of the differential PWM output signals 419. The second exemplary embodiment 801 may include feedback resistors $R_{4A}$ and $R_{4B}$ that couple respective output terminals to respective input terminals of differential amplifier 810. In some exemplary embodiments, resistor values of $R_{4A}$ and $R_{4B}$ may be similar (e.g., $R_4$). In some exemplary embodiments, a gain of the second exemplary embodiment 801 may be determined, at least in part, by a ratio of feedback resistor $R_4$ values to sense resistor $R_{SNS}$ values. A transfer function $H_6(s)$ describing a ratio of output signals (e.g., differential correction signals 421) to input signals (e.g., differential PWM output signals 419) may be expressed by equation 6, shown below:

$$H_6(s) = \frac{R_4}{R_{SNS}} \qquad \text{(eq. 6)}$$

Since differential amplifier 810 is coupled to the second differential amplifiers 502A and 502B via differential correction signals 421, an overall transfer function describing the combination of differential amplifier 810 and the differential class-D amplifier 410 may include contributions from equations 5 and 6. An overall transfer function $H_7(s)$ describing a ratio of output signals (e.g., differential PWM output signals 419) to input signals (e.g., differential input signals 411) may be expressed by equation 7, shown below:

$$H_7(s) = \frac{1}{sC_2R_3} \frac{R_4}{R_{SNS}} \qquad \text{(eq. 7)}$$

Figure 8C:
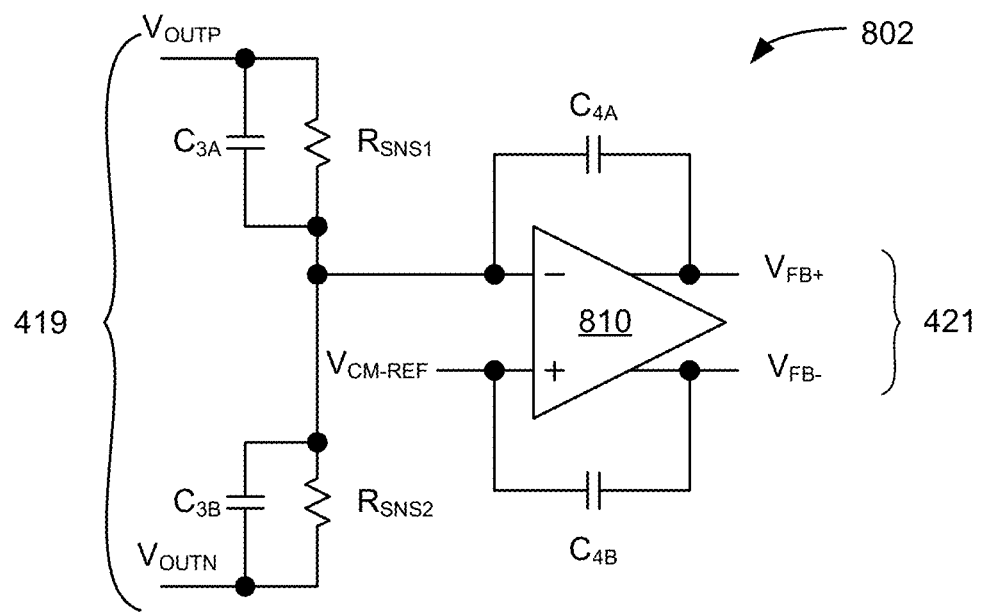
FIG. 8C is a circuit diagram of a third exemplary embodiment of the correction circuit of FIG. 7.

FIG. 8C is a circuit diagram of a third exemplary embodiment 802 of common-mode feedback circuit 420 of FIG. 5. Similar to first exemplary embodiment 800 of FIG. 8A and second exemplary embodiment 801 of FIG. 8B, third exemplary embodiment 802 may include differential amplifier 810 and sense resistors $R_{SNS1}$ and $R_{SNS2}$ that may be configured to sense the common-mode voltage of the differential PWM output signals 419.

In addition, third exemplary embodiment 802 may include capacitors $C_{3A}$ and $C_{3B}$ coupled in parallel with respective sense resistors $R_{SNS1}$ and $R_{SNS2}$. The combination of capacitor $C_{3A}$ and resistor $R_{SNS1}$ may form a first filter, and the combination of capacitor $C_{3B}$ and resistor $R_{SNS2}$ may form a second filter; together, the first and second filters may filter the determined common-mode voltage. In some exemplary embodiments, capacitance values of $C_{3A}$ and $C_{3B}$ may be substantially similar (e.g., $C_3$) and resistance values of $R_{SNS1}$ and $R_{SNS2}$ may also be substantially similar (e.g., $R_{SNS}$). Differential amplifier 810 may generate differential correction signals 421 based on the common-mode reference voltage $V_{CM-REF}$ and the common-mode voltage of the differential PWM output signals 419.

Third exemplary embodiment 802 may include feedback capacitors $C_{4A}$ and $C_{4B}$ that couple respective output terminals to respective input terminals of differential amplifier 810. In some exemplary embodiments, capacitance values of $C_{4A}$ and $C_{4B}$ may be substantially similar (e.g., $C_4$). In some exemplary embodiments, a gain of the third exemplary embodiment 802 may be determined, at least in part, by a ratio of feedback capacitor C4 values to sense resistor $R_{SNS}$ values. A transfer function $H_8(s)$ describing a ratio of output signals (e.g., differential correction signals 421) to input signals (differential PWM output signals 419) may be expressed by equation 8, shown below:

$$H_8(s) = \frac{1 + sC_3 R_{SNS}}{sC_4 R_{SNS}} \quad \text{(eq. 8)}$$

Thus, an overall transfer function $H_9(s)$ describing a ratio of output signals (e.g., differential PWM output signals 419) to input signals (e.g., differential input signals 411) may be expressed by equation 9, shown below:

$$H_9(s) = \frac{1}{sC_2 R_3} \frac{1 + sC_3 R_{SNS}}{sC_4 R_{SNS}} \quad \text{(eq. 9)}$$

The exemplary embodiments of common-mode feedback circuit 420 described above in conjunction with FIGS. 8A-8C are meant to show exemplary approaches for generating differential correction signals 421 to control the common-mode voltage of the differential class-D amplifier 410. Thus, the exemplary embodiments described in FIGS. 6A-6C are meant to be demonstrative and not limiting.

Figure 9:
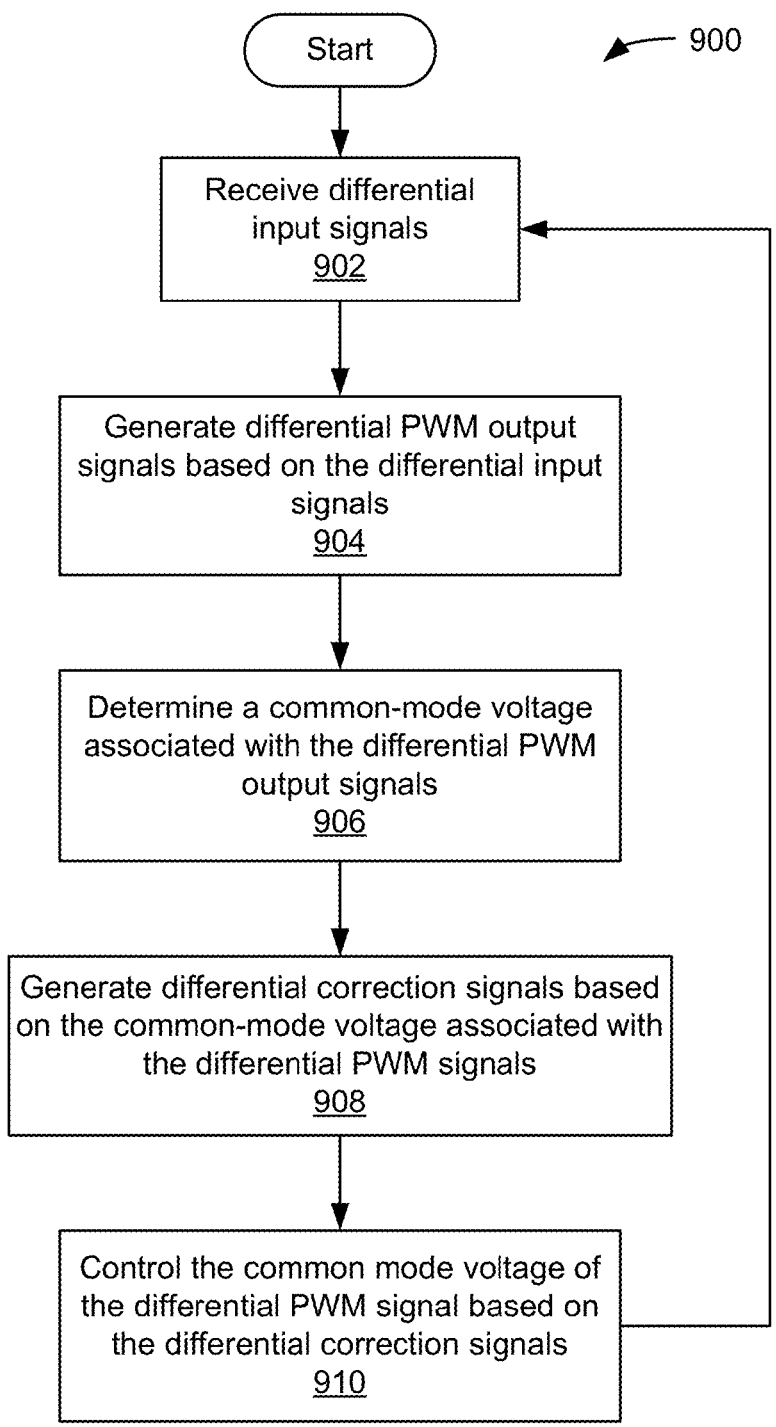
FIG. 9 shows an illustrative flow chart depicting an exemplary operation for the wireless device of FIG. 1, in accordance with exemplary embodiments.

FIG. 9 shows an illustrative flow chart depicting an exemplary operation 900 for class-D amplifier module 350 of FIG. 4, in accordance with exemplary embodiments. Some exemplary embodiments may perform the operations described herein with additional operations, fewer operations, operations in a different order, operations in parallel, and/or some operations differently. Referring also to FIGS. 7 and 8A-8C, differential class-D amplifier 410 receives differential input signals 411 (902). In some exemplary embodiments, differential input signals 411 may be received by first integration and gain stage 412 and/or first differential amplifier 501. Next, differential class-D amplifier 410 generates differential PWM output signals 419 based on the differential input signals 411 (904). In some exemplary embodiments, the differential PWM output signals 419 may also be based on an integrated periodic square wave signal and differential correction signals 421.

Next, a common-mode voltage associated with the differential PWM output signals 419 is determined (906). In some exemplary embodiments, the differential class-D amplifier module 350 may include a common-mode feedback circuit 420. The common-mode feedback circuit 420 may include sense resistors $R_{SNS1}$ and $R_{SNS2}$ configured to determine the common-mode voltage associated with the differential PWM output signals 419. Next, differential correction signals 421 may be generated based on the common-mode voltage associated with the differential PWM output signals 419 (908). In some exemplary embodiments, common-mode feedback circuit 420 may include differential amplifier 810 to generate differential correction signals 421 based on the common-mode voltage associated with the differential PWM output signals 419 (determined at 906) and a reference voltage (e.g., $V_{CM-REF}$).

Next, the common-mode voltage associated with the differential PWM output signals 419 is controlled through the differential correction signals 421 (910). In some exemplary embodiments, the differential correction signals 421 may be provided to differential class-D amplifier 410 to modify the differential PWM output signals 419. Operations may proceed to 902 to enable continuous monitoring and correcting of the common-mode voltage associated with the differential PWM output signals 419.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media.

In the foregoing specification, the exemplary embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. An apparatus comprising:
    a first circuit, including a first integration and gain stage and including a second integration and gain stage to amplify differential input signals, configured to receive differential correction signals to control a common-mode voltage associated with amplified differential pulse width modulated (PWM) signals; and
    a second circuit configured to generate the differential correction signals based, at least in part, on a reference voltage corresponding to a common-mode voltage and the common mode voltage associated with the amplified differential PWM signals, the amplified differential PWM signals based on a square wave signal integrated by the first integration and gain stage or the second integration and gain stage or a combination thereof.

2. The apparatus of claim 1, wherein at least the first integration and gain stage or the second integration and gain stage or a combination thereof is configured to receive the differential correction signals.

3. The apparatus of claim 1, the first circuit comprising a plurality of differential amplifiers configured to receive the differential correction signals.

4. The apparatus of claim 1, the second circuit comprising a differential amplifier configured to generate the differential correction signals.

5. The apparatus of claim 4, the second circuit comprising a plurality of sense resistors coupled to the differential amplifier and configured to determine the common-mode voltage associated with the amplified differential PWM signals.

6. The apparatus of claim 4, the second circuit comprising:
    a plurality of feedback resistors configured to couple output terminals of the differential amplifier to input terminals of the differential amplifier; and
    a plurality of input resistors coupled to the input terminals of the differential amplifier.

7. The apparatus of claim 4, the second circuit comprising a plurality of feedback capacitors to couple output terminals of the differential amplifier to input terminals of the differential amplifier.

8. An apparatus comprising:
    means for receiving differential correction signals to control a common-mode voltage associated with amplified differential pulse width modulated (PWM) signals;
    first and second means for integrating and amplifying differential input signals; and
    means for generating the differential correction signals based, at least in part, on a reference voltage corresponding to a common-mode voltage and the common mode voltage associated with the amplified differential PWM signals, wherein the amplified differential PWM signals are based on a square wave signal integrated by the first means or the second means or a combination thereof.

9. The apparatus of claim 8, wherein the means for receiving differential correction signals is to receive the differential correction signals via a plurality of differential amplifiers.

10. The apparatus of claim 8, wherein the means for generating the differential correction signals is to differentially amplify the common-mode voltage associated with the amplified differential PWM signals and the reference voltage.

11. The apparatus of claim 10, wherein the means for generating the differential correction signals is to determine the common-mode voltage associated with the amplified differential PWM signals via a plurality of sense resistors.

12. The apparatus of claim 8, wherein the differential correction signals are determined via a ratio of feedback resistor values to sense resistor values.

13. The apparatus of claim 8, wherein the differential correction signals are determined via a ratio of feedback capacitor values to sense resistor values.

14. A method comprising:
    receiving differential correction signals to control a common-mode voltage associated with amplified differential pulse width modulated (PWM) signals; and
    generating the differential correction signals based, at least in part, on a reference voltage corresponding to a common-mode voltage and the common mode voltage associated with the amplified differential PWM signals, wherein the amplified differential PWM signals are based on an integrated square wave signal.

15. The method of claim 14, wherein generating the differential correction signals further comprises:
    filtering the common mode voltage associated with the amplified differential PWM signals, wherein the differential correction signals are based, at least in part, on a ratio of feedback capacitance values to sense resistance values.

* * * * *